US010256148B2

(12) United States Patent
Priewasser

(10) Patent No.: US 10,256,148 B2
(45) Date of Patent: Apr. 9, 2019

(54) METHOD OF PROCESSING WAFER

(71) Applicant: DISCO Corporation, Tokyo (JP)

(72) Inventor: Karl Heinz Priewasser, Munich (DE)

(73) Assignee: DISCO Corporation, Tokyo (JP)

( * ) Notice: Subject to any disclaimer, the term of this patent is extended or adjusted under 35 U.S.C. 154(b) by 0 days.

(21) Appl. No.: 15/251,283

(22) Filed: Aug. 30, 2016

(65) Prior Publication Data

US 2017/0062278 A1 Mar. 2, 2017

(30) Foreign Application Priority Data

Aug. 31, 2015 (DE) ........................ 10 2015 216 619

(51) Int. Cl.
*H01L 21/78* (2006.01)
*H01L 21/56* (2006.01)
(Continued)

(52) U.S. Cl.
CPC ............ *H01L 21/78* (2013.01); *H01L 21/304* (2013.01); *H01L 21/568* (2013.01);
(Continued)

(58) Field of Classification Search
CPC ... H01L 21/78; H01L 21/7806; H01L 21/568; H01L 21/304; H01L 24/94
See application file for complete search history.

(56) References Cited

U.S. PATENT DOCUMENTS 6,777,267 B2 * 8/2004 Ruby .................. H01L 21/50
257/E21.499
2004/0147120 A1 7/2004 Rogalli et al.
(Continued)

FOREIGN PATENT DOCUMENTS

CN 1808692 A 7/2006
CN 101483144 A 7/2009
(Continued)

OTHER PUBLICATIONS

Search report issued by the Patent Office of Taiwan for corresponding TW Application No. 105127887, dated Dec. 6, 2017.
(Continued)

*Primary Examiner* — Syed I Gheyas
(74) *Attorney, Agent, or Firm* — Greer Burns & Crain Ltd.

(57) ABSTRACT

The invention relates to a method of processing a wafer, having on one side a device area with a plurality of devices partitioned by a plurality of division lines and a peripheral marginal area having no devices and being formed around the device area, wherein the device area is formed with a plurality of protrusions protruding from a plane surface of the wafer. The method comprises attaching a protective film, for covering the devices on the wafer, to the one side of the wafer, wherein the protective film is adhered to at least a part of the one side of the wafer with an adhesive, and providing a carrier having a curable resin applied to a front surface thereof. The method further comprises attaching the one side of the wafer, having the protective film attached thereto, to the front surface of the carrier, so that the protrusions protruding from the plane surface of the wafer are embedded in the curable resin and a back surface of the carrier opposite to the front surface thereof is substantially parallel to the side of the wafer being opposite to the one side, and grinding the side of the wafer being opposite to the one side for adjusting the wafer thickness.

13 Claims, 5 Drawing Sheets

(51) Int. Cl.
   *H01L 21/304* (2006.01)
   *H01L 23/00* (2006.01)
   *H01L 21/683* (2006.01)
(52) U.S. Cl.
   CPC ...... *H01L 21/6835* (2013.01); *H01L 21/6836* (2013.01); *H01L 24/94* (2013.01); *H01L 2221/6834* (2013.01); *H01L 2221/68318* (2013.01); *H01L 2221/68327* (2013.01); *H01L 2221/68381* (2013.01); *H01L 2224/94* (2013.01); *H01L 2924/10253* (2013.01); *H01L 2924/12041* (2013.01); *H01L 2924/14* (2013.01); *H01L 2924/1461* (2013.01)

(56) References Cited

U.S. PATENT DOCUMENTS

2008/0200037 A1    8/2008  Tsai et al.
2011/0281504 A1   11/2011  Omomoto
2014/0084423 A1*   3/2014  Priewasser .............. H01L 21/78
                                                          257/619
2015/0031215 A1*   1/2015  Mahoney ............ H01L 21/6836
                                                          438/759

FOREIGN PATENT DOCUMENTS

| CN | 103700584 A  | 4/2014 |
| JP | 2012119594 A | 6/2012 |
| JP | 5320058 B2   | 7/2013 |
| JP | 5324212 B2   | 7/2013 |
| TW | 200830392 A  | 7/2008 |
| TW | 201526093 A  | 7/2015 |

OTHER PUBLICATIONS

Chinese office action issued in parallel Chinese patent application No. CN 201610730785.7, dated Nov. 29, 2018 (with translation).

* cited by examiner

METHOD OF PROCESSING WAFER

TECHNICAL FIELD

The present invention relates to a method of processing a wafer, such as a semiconductor wafer, having on one side a device area with a plurality of devices partitioned by a plurality of division lines and a peripheral marginal area having no devices and being formed around the device area, wherein the device area is formed with a plurality of protrusions protruding from a plane surface of the wafer.

TECHNICAL BACKGROUND

In a semiconductor device fabrication process, a wafer having a device area with a plurality of devices partitioned by a plurality of division lines is divided into individual dies. This fabrication process generally comprises a grinding step for adjusting the wafer thickness and a cutting step of cutting the wafer along the division lines to obtain the individual dies. The grinding step is performed from a back side of the wafer which is opposite to a wafer front side on which the device area is formed.

In known semiconductor device fabrication processes, such as Wafer Level Chip Scale Package (WLCSP), the device area of the wafer is formed with a plurality of protrusions, such as bumps, protruding from a plane surface of the wafer. These protrusions are used, for example, for establishing an electrical contact with the devices in the individual dies, e.g., when incorporating the dies in electronic equipment, such as mobile phones and personal computers.

In order to achieve a size reduction of such electronic equipment, the semiconductor devices have to be reduced in size. Hence, wafers having the devices formed thereon are ground in the grinding step referred to above to thicknesses in the μm range, e.g., in the range from 30 to 100 μm.

However, in known semiconductor device fabrication processes, problems may arise in the grinding step if protrusions, such as bumps, protruding from a plane surface of the wafer are present in the device area. Specifically, due to the presence of these protrusions, the risk of breakage of the wafer during grinding is significantly increased. Further, if the wafer is ground to a small thickness, e.g., a thickness in the μm range, the protrusions of the device area on the front side of the wafer may cause a deformation of the wafer back side, due to the reduced thickness of the wafer and the pressure applied thereto in the grinding process. This latter effect is referred to as "pattern transfer", since the pattern of the protrusions on the wafer front side is transferred to the wafer back side, and results in an undesired unevenness of the back side surface of the wafer, thus compromising the quality of the resulting dies.

Moreover, the presence of the protrusions in the device area of the wafer also significantly increases the risk of damage to the wafer in the cutting step referred to above. In particular, due to the reduced wafer thickness after grinding, the sidewalls of the dies may crack in the cutting process, thus severely damaging the resulting dies.

Hence, there remains a need for a reliable and efficient method of processing a wafer having a device area with protrusions formed on one side thereof which allows for any risk of damage to the wafer to be minimised.

SUMMARY OF THE INVENTION

Accordingly, it is an object of the present invention to provide a reliable and efficient method of processing a wafer having a device area with protrusions formed on one side thereof which allows for any risk of damage to the wafer to be minimised. This goal is achieved by a wafer processing method with the technical features of claim 1. Preferred embodiments of the invention follow from the dependent claims.

The invention provides a method of processing a wafer, having on one side a device area with a plurality of devices partitioned by a plurality of division lines and a peripheral marginal area having no devices and being formed around the device area, wherein the device area is formed with a plurality of protrusions or projections protruding, extending or projecting from a plane surface of the wafer. The method comprises attaching a protective film, for covering the devices on the wafer, to the one side of the wafer, wherein the protective film is adhered to at least a part of the one side of the wafer with an adhesive, and providing a carrier having a curable resin applied to a front surface thereof. The method further comprises attaching the one side of the wafer, having the protective film attached thereto, to the front surface of the carrier, so that the protrusions protruding from the plane surface of the wafer are embedded or received in the curable resin and a back surface of the carrier opposite to the front surface thereof is substantially parallel to the side of the wafer being opposite to the one side, and grinding the side of the wafer being opposite to the one side for adjusting the wafer thickness.

The protrusions or projections, such as bumps, protrude, extend or project from a plane surface of the wafer which is a substantially flat surface. The protrusions or projections define a surface structure or topography of the one side of the wafer, rendering this one side uneven.

The protrusions may be irregularly arranged or arranged in a regular pattern. Only some of the protrusions may be arranged in a regular pattern.

The protrusions may have any type of shape. For example, some or all of the protrusions may be in the shape of spheres, semi-spheres, pillars or columns, e.g., pillars or columns with a circular, elliptic or polygonal, such as triangular, square etc., cross-section or base area, cones, truncated cones or steps.

At least some of the protrusions may arise from elements formed on the plane surface of the wafer. At least some of the protrusions may arise from elements partly or entirely penetrating the wafer in its thickness direction, e.g., for the case of a through silicon via (TSV). These latter elements may extend along part of the wafer thickness or along the entire wafer thickness.

The protrusions may have a height in the thickness direction of the wafer in the range of 20 to 300 μm, preferably 40 to 250 μm, more preferably 50 to 200 μm and even more preferably 70 to 150 μm.

All the protrusions may have substantially the same shape and/or size. Alternatively, at least some of the protrusions may differ from each other in shape and/or size.

According to the wafer processing method of the present invention, the protective film is attached to the one side of the wafer, i.e., the wafer front side, and the one side of the wafer, having the protective film attached thereto, is attached to the front surface of the carrier, so that the protrusions formed in the device area are embedded in the curable resin and the plane back surface of the carrier is substantially parallel to the side of the wafer being opposite to the one side, i.e., to the wafer back side. In this way, a wafer unit comprising the wafer, the protective film and the carrier with the curable resin applied thereto is formed, which allows for any negative influence of the surface unevenness arising from the presence of the protrusions in the device area on subsequent wafer processing steps to be eliminated.

In particular, by embedding the protrusions in the resin applied to the front surface of the carrier, the protrusions are reliably protected from any damage during wafer processing, for example, in subsequent grinding and cutting steps.

Further, the back surface of the carrier, which forms a first surface of the wafer unit referred to above, and the back side of the wafer, which forms a second surface of the wafer unit, are substantially parallel to each other. Hence, when grinding the back side of the wafer for adjusting the wafer thickness, a suitable counter pressure can be applied to the back surface of the carrier, e.g., by placing this back surface on a chuck table.

Since the plane back surface of the carrier is substantially parallel to the back side of the wafer, the pressure applied to the wafer during the grinding process, e.g., by a grinding wheel of a grinding apparatus, is evenly and homogenously distributed over the wafer, thus minimising any risk of a pattern transfer, i.e., a transfer of the pattern defined by the protrusions in the device area to the ground wafer back side, and breakage of the wafer. Further, the substantially parallel alignment of the flat, even back surface of the carrier and the back side of the wafer allows for the grinding step to be carried out with a high degree of precision, thus achieving a particularly uniform and homogenous wafer thickness after grinding.

The protective film covers the devices formed in the device area of the wafer, therefore protecting the devices from damage and contamination, e.g., by residues of the curable resin. Moreover, the protective film facilitates removal of the carrier with the curable resin from the wafer after processing. Also, the protective film acts as a cushion or buffer between the wafer front side and the resin, thus further contributing to the uniform and homogenous distribution of pressure during grinding. Hence, a pattern transfer or breakage of the wafer during the grinding process can be particularly reliably prevented.

In this regard, it is particularly preferable that the protective film is compressible, elastic, flexible and/or pliable. In this way, the cushioning or buffering effect of the protective film can be further enhanced.

Therefore, the wafer processing method of the present invention allows for the risk of any damage to the wafer, such as a pattern transfer or wafer breakage, to be minimised in a reliable and efficient way.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an InAs wafer, an InP wafer, a SiC wafer, a SiN wafer, a IT (lithium tantalate) wafer, a IN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The method may further comprise cutting the wafer along the division lines. The wafer may be cut from the front side or the back side thereof.

The cutting may be performed by mechanical cutting, e.g., by blade dicing or sawing, and/or by laser cutting and/or by plasma cutting. The wafer may be cut in a single mechanical cutting step, a single laser cutting step or a single plasma cutting step. Alternatively, the wafer may be cut by a sequence of mechanical cutting and/or laser cutting and/or plasma cutting steps.

The cutting of the wafer may be performed in a state in which the protective film and the carrier are attached to the wafer. In this way, it can be ensured that the pressure applied during the cutting step is uniformly and homogenously distributed throughout the wafer during cutting, thus minimising any risk of damage to the wafer, e.g., cracking of the sidewalls of the resulting dies, in the cutting step. In this case, it is particularly preferred that the wafer be cut from the back side thereof.

The curable resin may be curable by an external stimulus, such as UV radiation, heat, an electric field and/or a chemical agent. In this case, the curable resin hardens at least to some degree upon application of the external stimulus thereto.

The curable resin may be a resin that exhibits a degree of compressibility, elasticity and/or flexibility after curing thereof, i.e., a resin that is compressible, elastic and/or flexible after curing. For example, the curable resin may be such that it is brought into a rubber-like state by curing. Alternatively, the curable resin may be a resin that reaches a rigid, hard state after curing.

Preferred examples of UV curable resins for use in the processing method of the invention are ResiFlat by the DISCO Corporation and TEMPLOC by DENKA.

The method may further comprise applying the external stimulus to the curable resin so as to cure the resin, before grinding the side of the wafer being opposite to the one side, i.e., the wafer back side. In this way, the protection of the wafer during grinding and the grinding accuracy can be further improved.

The method may further comprise removing the carrier with the curable or cured resin applied thereto and the protective film from the wafer. For example, the carrier and the protective film may be removed from the wafer after grinding or after grinding and cutting. In this way, the individual dies can be separated and picked up in a simple and reliable manner.

As has been detailed above, the protective film facilitates removal of the carrier with the curable or cured resin applied thereto from the wafer. In particular, due to the presence of the protective film, the carrier with the resin can be removed from the wafer in a reliable and simple manner, avoiding any resin residues in the device area, thus preventing contamination of the devices, and minimising the risk of damaging the protrusions in the removal process.

The carrier with the cured resin can be removed after curing in a particularly reliable and efficient manner if the curable resin is a resin that exhibits a degree of compressibility, elasticity and/or flexibility, i.e., is compressible, elastic and/or flexible, for example, rubber-like, after curing.

If the curable resin is a resin that reaches a rigid, hard state upon curing, removal of the carrier and the cured resin from the wafer may be facilitated by applying an external stimulus to the cured resin, softening or removing the resin at least to some extent. For example, some curable resins, such as TEMPLOC by DENKA, may be treated by applying hot water thereto after curing, in order to soften the cured resin and allow for a particularly easy removal of the carrier and the resin from the wafer.

In the step of removing the carrier with the curable or cured resin applied thereto and the protective film from the wafer, the carrier, the resin and the film may be removed together in a single process step. This approach allows for a particularly efficient removal process.

Alternatively, the carrier, the resin and the protective film may be removed individually, i.e., one after the other. Further, the carrier and the resin may be removed together first, followed by the removal of the protective film. In another embodiment, the carrier may be removed first, followed by removing the resin and the protective film together.

The cutting of the wafer may be performed after removing the carrier with the curable or cured resin applied thereto and the protective film from the wafer. This approach allows for the individual dies to be separated and picked up immediately after the cutting step. In this case, it is particularly preferable to perform the cutting step from the front side of the wafer.

The adhesive may be provided over an entire contact area of the one side of the wafer and the protective film. In this way, it can be ensured that the protective film is particularly reliably held in place on the one side of the wafer. Further, after cutting of the wafer, the resulting separated dies can be securely held by the protective film, thus preventing any undesired shift or movement of the dies.

In particular, the adhesive may be provided over an entire surface of the protective film which is in contact with the one side of the wafer.

The adhesive may be curable by an external stimulus, such as heat, UV radiation, an electric field and/or a chemical agent. In this way, the protective film can be particularly easily removed from the wafer after processing. The external stimulus may be applied to the adhesive so as to lower the adhesive force thereof, thus allowing for an easy removal of the protective film.

The step of attaching the protective film to the one side of the wafer may be carried out in a vacuum chamber. In particular, the protective film may be attached to the one side of the wafer by using a vacuum laminator. In such a vacuum laminator, the wafer is placed on a chuck table in a vacuum chamber in a state in which the wafer back side is in contact with an upper surface of the chuck table and the wafer front side is oriented upward. The protective film to be attached to the wafer front side is held at its peripheral portion by an annular frame and placed above the wafer front side in the vacuum chamber. An upper part of the vacuum chamber which is situated above the chuck table and the annular frame is provided with an air inlet port closed by an expandable rubber membrane.

After the wafer and the protective film have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective film against the wafer front side, sealing the peripheral water portion with the protective film and pressing the film against the device area on the wafer front side. Hence, the protective film can be attached closely to the wafer front side, so as to follow the contours of the protrusions in the device area.

Subsequently, the vacuum in the vacuum chamber is released and the protective film is held in position on the wafer front side by the adhesive and the positive pressure in the vacuum chamber.

Alternatively, the rubber membrane can be replaced by a soft stamp or a soft roller.

The protective film may be attached to the one side of the wafer so that the film only partially follows the contours of the protrusions. For example, the protective film may follow only upper portions of the protrusions in the thickness direction of the wafer. Such an arrangement of the protective film may allow for a particularly easy removal of the carrier with the curable or cured resin applied thereto and the protective film from the wafer.

Alternatively, the protective film may be attached to the wafer front side so as to closely follow the contours of the protrusions. In this way, the protrusions with the protective film attached thereto can be particularly reliably embedded in the curable resin.

The protective film may be expandable. The protective film may be expanded when being attached to the one side of the wafer, so as to follow the contours of the protrusions protruding from the plane surface of the wafer.

In particular, the protective film may be expandable to twice its original size or more, preferably three times its original size or more and more preferably four times its original size or more. In this way, in particular, for the case of an expansion to three or four times its original size or more, it can be reliably ensured that the protective film closely follows the contours of the protrusions.

The method may further comprise cutting of a portion of the carrier with the curable or cured resin applied thereto which laterally extends beyond a circumference of the wafer, before grinding the side of the wafer being opposite to the one side. In this way, handling the wafer unit, comprising the wafer, the protective film and the carrier with the curable or cured resin applied thereto, during grinding and in possible subsequent processing steps is further facilitated.

The carrier may be made of a rigid or hard material, such as PET and/or silicon and/or glass and/or SUS. For example, if the carrier is made of PET or glass and the resin is curable by an external stimulus, the resin may be cured with radiation that is transmittable through PET or glass, for instance UV radiation. If the carrier is made of silicon or SUS, a cost-efficient carrier is provided. Also a combination of the materials listed above is possible.

The carrier may have a thickness in the range of 200 to 1500 μm, preferably 400 to 1200 μm and more preferably 500 to 1000 μm.

The protective film may have a thickness in the range of 5 to 200 μm, preferably 5 to 100 μm, more preferably 8 to 80 μm and even more preferably 10 to 50 μm. In this way, it can be ensured that the protective film is flexible and pliable enough to sufficiently conform to the contours of the protrusions in the device area and, at the same time, exhibits a sufficient thickness in order to reliably and efficiently provide the cushioning or buffering effect described above.

The protective film may be made of a polymer material, such as polyvinyl chloride (FVC) or ethylene vinyl acetate (EVA). For example, the protective film may be a "Saran" wrap-like material.

The diameter of the protective film in the attached state thereof may be approximately the same as the diameter of the wafer.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods for processing a wafer W.

The wafer W can be, for example, a MEMS wafer having MEMS devices formed on a front side surface thereof, which is called a pattern side 1 in the following description. However, the wafer W is not limited to a MEMS wafer, but may also be a CMOS wafer having CMOS devices, preferably as solid-state imaging devices, formed on the pattern side 1 thereof or a wafer with other types of devices on the pattern side 1.

The wafer W may be made of a semiconductor, e.g., silicon. Such a silicon wafer W can include devices, such as ICs (integrated circuits) and LSIs (large scale integrations), on a silicon substrate. Alternatively, the wafer may be an optical device wafer configured by forming optical devices, such as LEDs (light emitting diodes), on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the µm range, preferably in the range of 625 to 925 µm.

The wafer W preferably exhibits a circular shape. The wafer W is provided with a plurality of crossing division lines 11 (see FIG. 3), called streets, formed on the pattern side 1 thereof, thereby partitioning the wafer W into a plurality of rectangular regions where devices, such as those described previously, are respectively formed. These devices are formed in a device area 2 of the wafer W. In the case of a circular wafer W, this device area 2 is preferably circular and arranged concentrically with the outer circumference of the wafer W.

Figure 1:
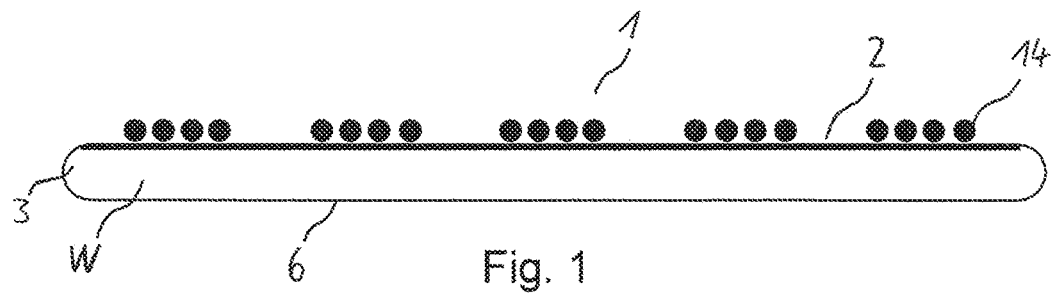
FIG. 1 is a cross-sectional view showing a wafer to be processed by the method of the present invention.
Figure 2:
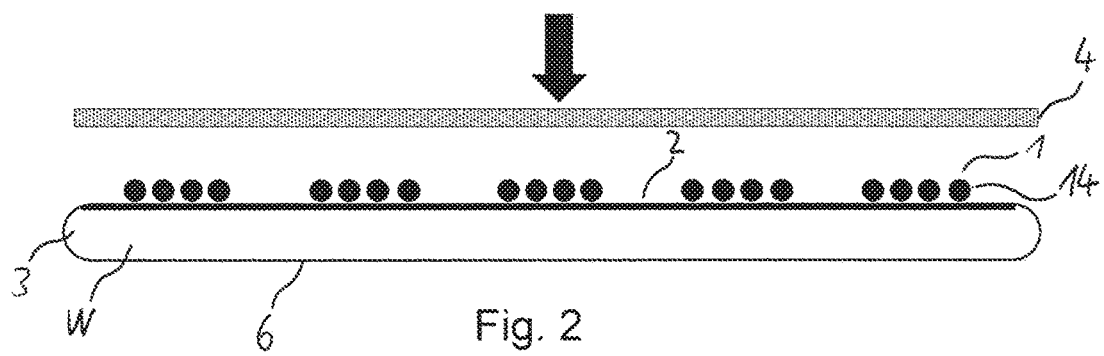
FIG. 2 is a cross-sectional view illustrating a first step of a method of processing a wafer according to a first embodiment of the present invention.
Figure 3:
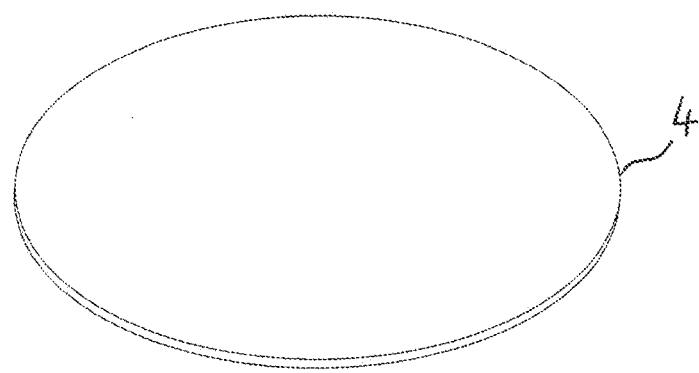
FIG. 3 is a perspective view illustrating the first step of the method of processing a wafer according to the first embodiment of the present invention.
Figure 3:
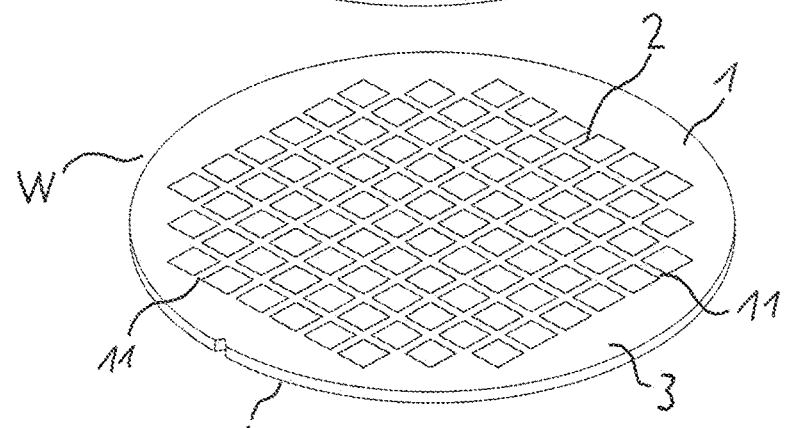

The device area 2 is surrounded by an annular peripheral marginal area 3, as is schematically shown in FIGS. 1 to 3. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The device area 2 is formed with a plurality of protrusions 14 protruding from a plane surface of the wafer W, as is schematically shown, for example, in FIGS. 1 and 2. The protrusions 14 may be, for example, bumps for establishing an electrical contact with the devices of the device area 2 in the separated dies. The height of the protrusions 14 in the thickness direction of the wafer W may be in the range of 70 to 200 µm.

In the following, a method of processing a wafer W according to a first embodiment of the present invention will be described with reference to FIGS. 1 to 13.

FIG. 1 shows a cross-sectional view of the wafer W to be processed by the method according to the first embodiment of the present invention. FIGS. 2 and 3 illustrate a first step of the processing method according to this first embodiment. In this first step, a protective film 4, for covering the devices on the wafer W, is attached to the pattern side 1 of the wafer W, as is indicated by an arrow in FIG. 2.

The protective film 4 preferably has the same shape as the wafer W, i.e., a circular shape in the present embodiment, and is concentrically attached thereto. The diameter of the protective film. 4 is approximately the same as that of the wafer W, as is schematically shown in FIGS. 2 and 3.

The protective film 4 covers the devices formed in the device area 2, including the protrusions 14, thus protecting the devices against damage or contamination. Further, the protective film 4 acts as an additional cushion in a subsequent grinding step, as will be detailed later.

The protective film 4 is adhered to the pattern side 1 of the wafer W with an adhesive (not shown). The adhesive is provided over an entire contact area of the pattern side 1 of the wafer W and the protective film 4. In particular, the adhesive is provided over an entire surface of the protective film 4 which is in contact with the pattern side 1 of the wafer W.

The adhesive may be curable by an external stimulus, such as heat, UV radiation, an electric field and/or a chemical agent. In this way, the protective film 4 can be particularly easily removed from the wafer W after processing.

In particular, the adhesive may be an acrylic resin or an epoxy resin. A preferred example of a UV curable-type resin for the adhesive is, e.g., urethane acrylate oligomer. Further, the adhesive may be, for example, a water soluble resin.

The protective film 4 may have a thickness in the range of 5 to 100 µm, e.g., 80 µm. The protective film 4 may be made of a polymer material, such as PVC or EVA.

The protective film 4 is pliable and extendable to approximately three times its original diameter.

For example, the step of attaching the protective film 4 to the pattern side 1 of the wafer W may be performed in a vacuum chamber, e.g., by using a vacuum laminator, as has been detailed above.

Figure 4:
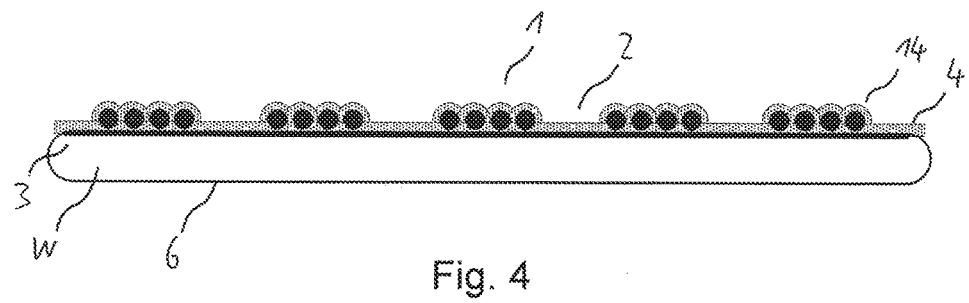
FIG. 4 is a cross-sectional view showing the outcome of the first step of the method of processing a wafer according to the first embodiment of the present invention.
Figure 5:
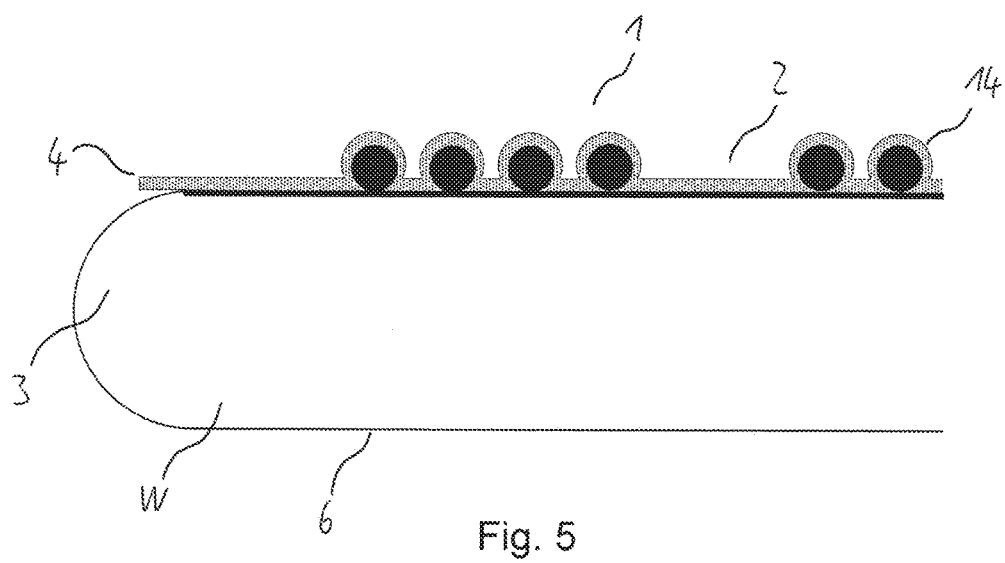
FIG. 5 is an enlarged view of the left-hand side of FIG. 4.

FIG. 1 schematically illustrates the outcome of the first step of the processing method according to the first embodiment of the present invention. FIG. 5 shows an enlarged view of the left-hand side of FIG. 4. In this first step, the protective film 4 is expanded to approximately three times its original diameter when being attached to the pattern side 1 of the wafer W, so as to closely follow the contours of the protrusions 14, as is schematically shown in FIGS. 4 and 5.

Figure 6:
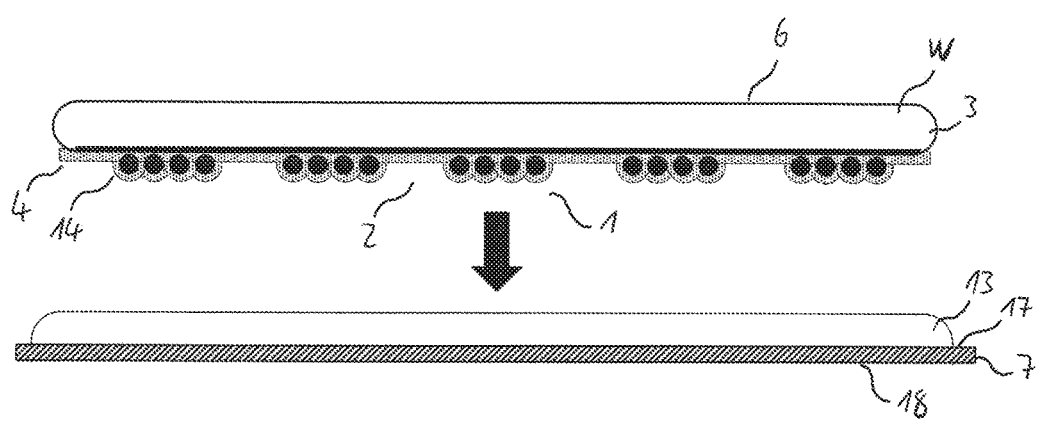
FIG. 6 is a cross-sectional view illustrating a second step of the method of processing a wafer according to the first embodiment of the present invention.

FIG. 6 illustrates a second step of the method of processing a wafer according to the first embodiment of the present invention. In this second step, a carrier 7 having a curable resin 13 applied to a front surface 17 thereof is provided. The carrier 7 is preferably made of a rigid material, such as polyethylene terephthalate (PET), silicon, glass or SUS.

Preferably, the carrier 7 has the same shape as the wafer W, i.e., a circular shape in the present embodiment, and is arranged concentrically thereto, as is illustrated in FIG. 6.

The carrier 7 may, for example, have a thickness in the range of 500 to 1000 µm.

The curable resin 13 is curable by an external stimulus, such as UV radiation, heat, an electric field and/or a chemical agent. In particular, the curable resin 13 may be ResiFlat by DISCO Corporation or TEMPLOC by DENKA. The layer of curable resin 13 formed on the front surface 17 of the carrier 7 may have a height in the thickness direction of the carrier 7 of approximately 50 to 1000 µm, preferably 200 to 1000 µm.

Further, in the second step of the processing method according to the first embodiment of the present invention, the pattern side 1 of the wafer K, having the protective film 4 attached thereto, is attached to the front surface 17 of the carrier 7, as is indicated by an arrow in FIG. 6, so that the protrusions 14 are embedded in the curable resin 13 and a back surface 16 of the carrier 7 opposite to the front surface 17 thereof is substantially parallel to the side of the wafer K being opposite to the pattern side 1, i.e., the back side 6 thereof (e.g., FIGS. 1 to 3). This substantially parallel alignment of the carrier back surface 18 and the wafer back side 6 is indicated by dashed arrows in FIG. 7.

Specifically, the wafer K, having the protective film 4 attached thereto, and the carrier 7 with the curable resin 13 are pressed together by applying a parallel pressing force to the wafer back side 6 and the back surface 18 of the carrier 7, for example, in a mounting chamber, so as to reliably embed the protrusions 14 in the curable resin 13 and achieve the substantially parallel alignment, of carrier back surface 16 and wafer back side 6. Details of pressing equipment and pressing operations suitable for this purpose are described in JP 5320058 B2 and JP 5324212 B2 for the case of using ResiFlat by the DISCO Corporation as a resin.

Figure 7:
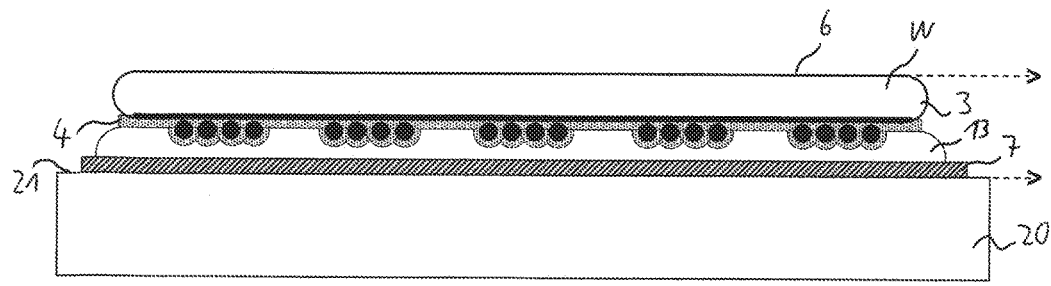
FIG. 7 is a cross-sectional view illustrating a third step of the method of processing a wafer according to the first embodiment of the present invention.

FIG. 7 illustrates a third step of the method according to the first embodiment of the present invention. In this third step, the wafer unit consisting of the wafer H, the protective film 4, the resin. 13 and the carrier 7 is placed on a chuck table 20 and the external stimulus is applied to the curable resin 13 so as to cure the resin 13.

For example, for the case of a heat curable, e.g., thermosetting, resin 13, the resin 13 may be cured by heating in an oven. For the case of a UV curable resin. 13, the resin 13 is cured by the application of UV radiation, e.g., through the carrier 7, if a carrier material is used which is transparent to this type of radiation, such as PET or glass.

Hence, the protrusions 14 are firmly held in the cured resin. 13 and the substantially parallel relative alignment of the carrier back surface 18 and the wafer back side 6 is reliably maintained.

As is shown in FIG. 7, the wafer unit is arranged on the chuck table 20 so that the carrier back surface 18 is in contact with a top surface 21 of the chuck table 20. Although the chuck table 20 has been omitted in FIGS. 8 and 9, the same or a similar chuck table arrangement as shown in FIG. 7 is also used in the steps illustrated in these figures.

Figure 8:
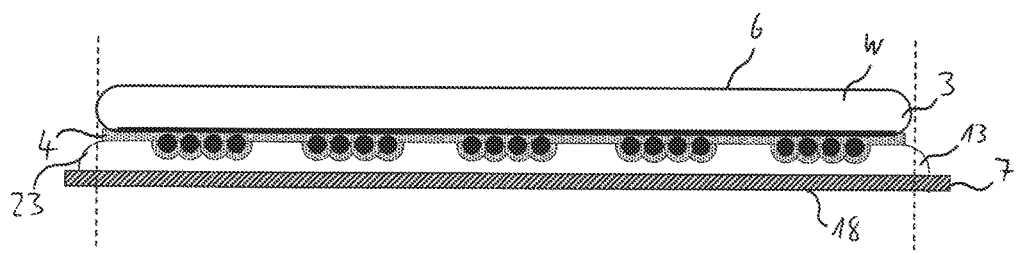
FIG. 8 is a cross-sectional view illustrating a fourth step of the method of processing a wafer according to the first embodiment of the present invention.

FIG. 8 illustrates an optional fourth step of the processing method according to the first embodiment of the invention. In this fourth step, a portion 23 of the carrier 7 with the cured resin 13 applied thereto which laterally extends beyond the circumference of the wafer W is cut off, as is indicated by dashed lines in FIG. 8. The portion 23 may be cut off, for example, by mechanical cutting, e.g., using a blade or a saw, laser cutting or plasma cutting. Cutting off the portion 23 facilitates handling of the wafer unit in the subsequent processing steps.

Figure 9:
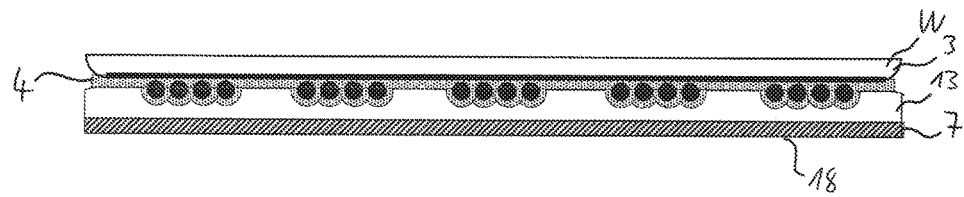
FIG. 9 is a cross-sectional view illustrating a fifth step of the method of processing a wafer according to the first embodiment of the present invention.

FIG. 9 illustrates the outcome of a fifth step of the processing method according to the first embodiment of the invention. In this fifth step, the back surface 18 of the carrier 7, which is a plane, flat surface, is placed on the top surface of a chuck table (not shown) which may be identical to the chuck table 20 in FIG. 7. Subsequently, the back side 6 of the wafer W is ground for adjusting the wafer thickness, e.g., to a value in the range of approximately 30 to 100 µm. The thickness can be the final thickness of the dies 26 (see FIG. 13).

This grinding of the back side 6 of the wafer W may be performed using a grinding apparatus (not shown). The grinding apparatus may comprise a spindle housing, a spindle rotatably accommodated in the spindle housing and a grinding wheel mounted to the lower end of the spindle. A plurality of abrasive members may be fixed to the lower surface of the grinding wheel, wherein each abrasive member may be formed from a diamond abrasive member configured by fixing diamond abrasive grains with a bond, such as a metal bond or a resin bond. The grinding wheel having the abrasive members is rotated at high speeds by driving the spindle, e.g., using a motor.

In the grinding step, the chuck table holding the wafer unit and the grinding wheel of the grinding apparatus are rotated and the grinding wheel is lowered so as to bring the abrasive members of the grinding wheel into contact with the back side 6 of the wafer W, thereby grinding the back side 6.

Since the plane back surface 18 of the carrier 7, which is placed on the top surface of the chuck table of the grinding apparatus, is substantially parallel to the back side 6 of the wafer W, the pressure applied to the wafer H by the grinding wheel during the grinding process is evenly and homogenously distributed over the wafer W. Hence, any risk of a pattern transfer or breakage of the wafer W can be minimised. Further, the substantially parallel alignment of the flat, even back surface 18 of the carrier 7 and the back side 6 of the wafer W allows for the grinding step to be carried out with a high degree of precision, thus achieving a particularly uniform and homogenous wafer thickness after grinding.

The protective film 4 covers the devices formed in the device area 2 of the wafer, therefore protecting the devices from damage and contamination, e.g., by residues of the curable resin 13. Moreover, the protective film 4 functions as a cushion or buffer between the pattern side 1 and the resin 13, thus further contributing to the uniform and homogenous distribution of pressure during grinding. Therefore, a pattern transfer or breakage of the wafer W during the grinding process can be particularly reliably prevented.

Figure 10:
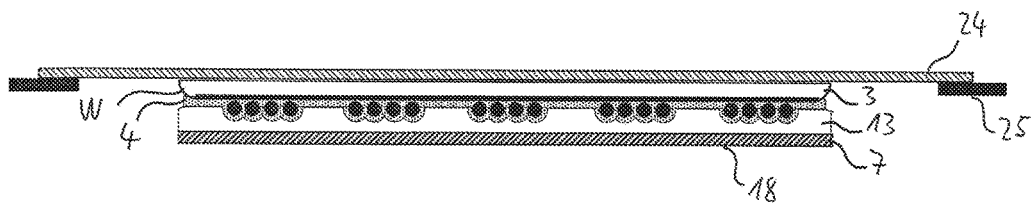
FIG. 10 is a cross-sectional view illustrating a sixth step of the method of processing a wafer according to the first embodiment of the present invention.

After the back side 6 of the wafer W has been ground, the wafer W is subjected to a sixth step of the processing method of the first embodiment, the outcome of which is illustrated in FIG. 10. In this sixth step, the wafer unit is placed on an adhesive pick-up tape 24 in such a way that the ground surface of the wafer W is in contact with the adhesive pick-up tape 24, as is shown in FIG. 10. A peripheral portion of the adhesive pick-up tape 24 is mounted on an annular frame 25. In this way, the wafer unit comprising the wafer W, the protective film 4, the cured resin 13 and the carrier 7 is securely held by the adhesive pick-up tape 24 and the annular frame 25.

Figure 11:
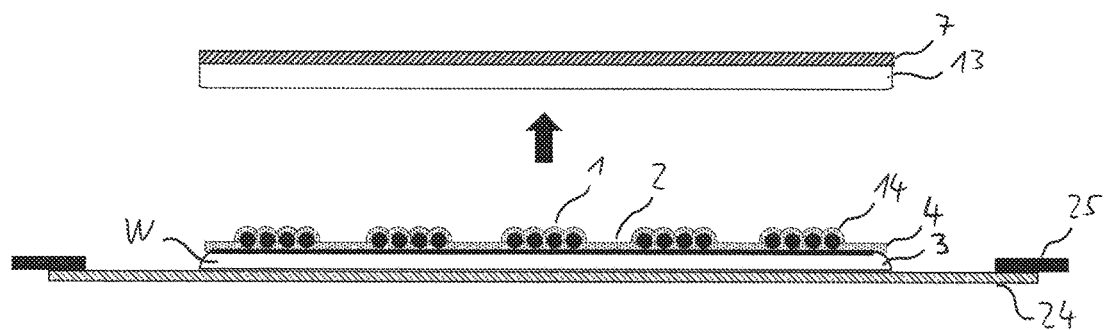
FIG. 11 is a cross-sectional view illustrating a seventh step of the method of processing a wafer according to the first embodiment of the present invention.

FIG. 11 illustrates a seventh step of the processing method according to the first embodiment. In this seventh step, the carrier 7, the cured resin 13 and the protective film 4 are removed from the wafer W.

Specifically, as is indicated by an arrow in FIG. 11, in the present embodiment, the carrier 7 and the cured resin 13 are first removed together from the wafer W having applied thereto the protective film 4. The presence of the protective film 4 on the pattern side 1 of the wafer W facilitates removal of the carrier 7 and the cured resin 13.

The resin 13 may be a resin that exhibits a degree of compressibility, elasticity and/or flexibility, e.g., a rubber-like behaviour, after curing, thus allowing for a particularly easy removal thereof from the wafer W. Alternatively or additionally, another external stimulus, such as hot water, may be applied to the cured resin 13 prior to removal thereof, in order to soften the cured resin 13 for further facilitating the removal process.

Subsequently, after removal of the carrier 7 and the cured resin 13, the protective film 4 is removed from the pattern side 1 of the wafer W. In particular, if the adhesive provided over the entire surface of the protective film 4 which is in contact with the pattern side 1 of the wafer W is curable by an external stimulus, such as UV radiation, heat, an electric field and/or a chemical agent, the external stimulus is applied to the adhesive, so as to lower the adhesive force thereof. In this way, the protective film 4 can be removed from the wafer F in a particularly simple and reliable manner.

Figure 12:
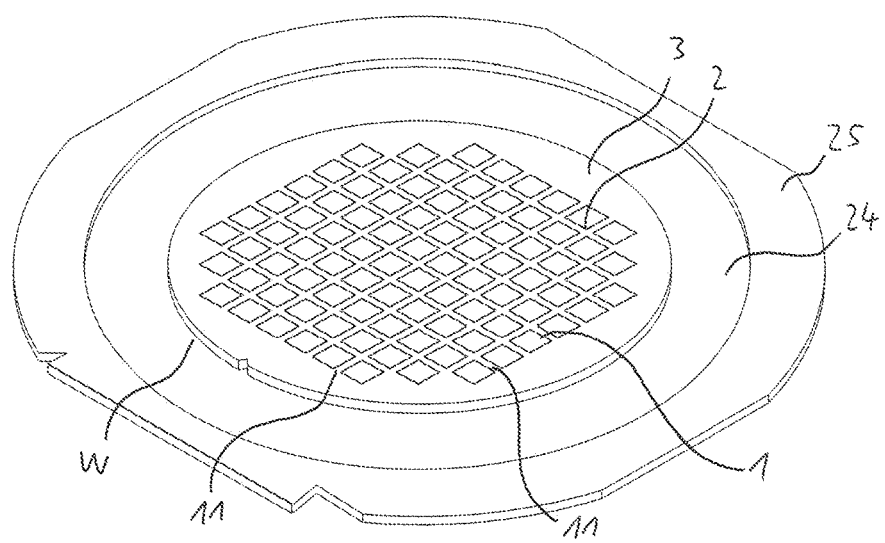
FIG. 12 is a perspective view showing the outcome of the seventh step of the method of processing a wafer according to the first embodiment of the present invention.

The outcome of the seventh step of the present embodiment is schematically shown in FIG. 12. Specifically, FIG. 12 shows the wafer W attached to the annular frame 25 through the adhesive pick-up tape 24 and having the protective film 4, the cured resin 13 and the carrier 7 removed therefrom.

Figure 13:
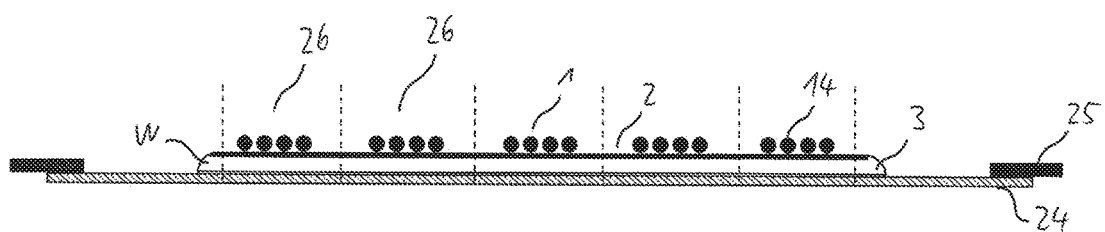
FIG. 13 is a cross-sectional view illustrating an eighth step of the method of processing a wafer according to the first embodiment of the present invention.

FIG. 13 illustrates an eighth step of the processing method according to the first embodiment of the invention. In this eighth step, the wafer W is cut along the division lines 11 from the pattern side 1 thereof, as is indicated by dashed lines in FIG. 13. In this way, the dies 26 are fully separated from each other. Cutting the wafer W may be performed by mechanical cutting, e.g., using a blade or a saw, and/or cutting by laser and/or cutting by plasma.

After the dies 26 have been completely separated from one another in the cutting step, they respectively adhere to the adhesive pick-up tape 24. The individual separated dies 26 can be picked-up from the adhesive pick-up tape 24 by a pick-up device (not shown). The spacing between the individual dies 26 can be increased by radially expanding or stretching the pick-up tape 24, e.g., by use of an expansion drum, in order to facilitate the pick-up process.

In the following, a method of processing a wafer W according to a second embodiment of the present invention will be described with reference to FIGS. 14 and 15. The method of the second embodiment differs from the method of the first embodiment in the sixth and seventh method steps illustrated in FIGS. 14 and 15, respectively.

Figure 14:
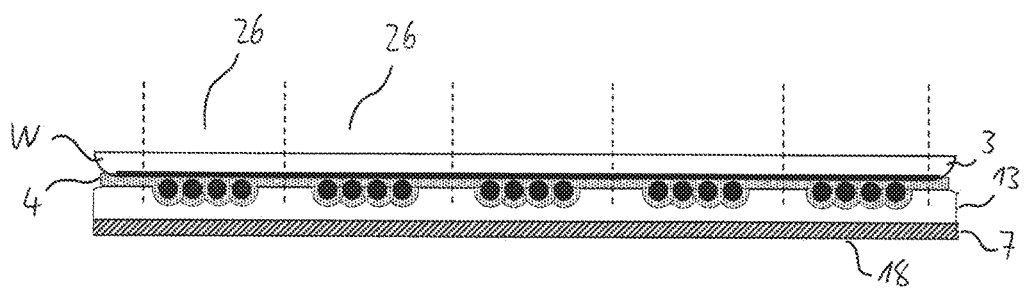
FIG. 14 is a cross-sectional view illustrating a sixth step of a method of processing a wafer according to a second embodiment of the present invention.

Specifically, as the sixth step in the method of the second embodiment, cutting of the wafer W is performed in a state in which the protective film 4, the cured resin 13 and the carrier 7 are attached to the wafer W, as is indicated by dashed lines in FIG. 14.

As is schematically shown in FIG. 14, this cutting process is performed from the ground back side surface of the wafer W. In this cutting process, the back surface 18 of the carrier 7 is placed on the top surface of a chuck table (not shown) which may be identical to the chuck table 20 shown in FIG. 7. Since the protrusions 14 are embedded in the cured resin 13 and the back surface 18 of the carrier 7 is supported by the top surface of the chuck table, the risk of any damage to the wafer W or the dies 26, such as breakage thereof, during cutting is minimised. The wafer W may be cut by mechanical cutting, e.g., using a blade or a saw, and/or cutting by laser and/or cutting by plasma.

By cutting the wafer W in this way, the dies 26 are fully separated from each other, i.e., no longer connected to each other by the wafer W. However, in the state shown in FIG. 14, the dies 26 are firmly held together by the cured resin 13.

Figure 15:
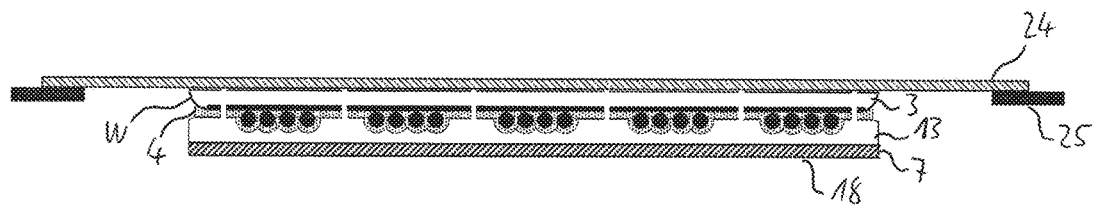
FIG. 15 is a cross-sectional view illustrating a seventh step of the method of processing a wafer according to the second embodiment of the present invention.

In the seventh step of the processing method according to the second embodiment, the outcome of which is shown in FIG. 15, the wafer unit comprising the wafer W, the protective film 4, the cured resin 13 and the carrier 7 is placed on an adhesive pick-up tape 24 mounted on an annular frame 25. The wafer unit is placed on the adhesive pick-up tape 24 in such a way that the ground back side surface of the cut wafer W is in contact with the adhesive pick-up tape 24, as is shown in FIG. 15.

Subsequently, the carrier 7, the cured resin 13 and the protective film 4 are removed from the wafer W substantially in the same manner as described above and illustrated in FIG. 11 for the processing method according to the first embodiment.

After removal of the carrier 7, the cured resin 13 and the protective film 4 from the wafer W, the individual separated dies 26 can be picked up from the adhesive pick-up tape 24 by a pick-up device (not shown.). The spacing between the individual dies 26 can be increased by radially expanding or stretching the pick-up tape 24, e.g., by use of an expansion drum, in order to facilitate the pick-up process.

The invention claimed is:

1. A method of processing a wafer, having on one side a device area with a plurality of devices partitioned by a plurality of division lines and a peripheral marginal area having no devices and being formed around the device area, wherein the device area is formed with a plurality of protrusions protruding from a plane surface of the wafer and the protrusions define an uneven surface topography, the method comprising:
    attaching a solid flexible protective film to the one side of the wafer, so as to closely follow at least upper portions of contours of the protrusions, wherein the solid flexible protective film is expandable and is adhered with an adhesive, the solid flexible protective film being expanded when being attached to the one side of the wafer so as to follow the uneven surface topography;
    providing a carrier having a curable resin applied to a front surface thereof;

attaching the one side of the wafer, having the solid flexible protective film attached thereto, to the front surface of the carrier, so that the protrusions protruding from the plane surface of the wafer are embedded in the curable resin and a back surface of the carrier opposite to the front surface thereof is substantially parallel to the side of the wafer being opposite to the one side; and grinding the side of the wafer being opposite to the one side for adjusting the wafer thickness.

2. The method according to claim 1, further comprising cutting the wafer along the division lines.

3. The method according to claim 1, further comprising removing the carrier with the curable resin applied thereto and the solid flexible protective film from the wafer.

4. The method according to claim 3, wherein the cutting of the wafer is performed after removing the carrier with the curable resin applied thereto and the solid flexible protective film from the wafer.

5. The method according to claim 2, wherein the cutting of the wafer is performed in a state in which the solid flexible protective film and the carrier are attached to the wafer.

6. The method according to claim 1, wherein the adhesive is provided over an entire contact area of the one side of the wafer and the solid flexible protective film.

7. The method according to claim 1, wherein the flexible protective film is expandable and the solid flexible protective film is expanded when being attached to the one side of the wafer, so as to follow the contours of the protrusions protruding from the plane surface of the wafer.

8. The method according to claim 1, wherein the curable resin is curable by an external stimulus, such as UV radiation, heat, an electric field and/or a chemical agent.

9. The method according to claim 8, further comprising applying the external stimulus to the curable resin so as to cure the resin, before grinding the side of the wafer being opposite to the one side.

10. The method according to claim 1, further comprising cutting off a portion of the carrier with the curable resin applied thereto which laterally extends beyond a circumference of the wafer, before grinding the side of the wafer being opposite to the one side (1).

11. The method according to claim 1, wherein the carrier is made of a rigid material, such as PET and/or silicon and/or glass and/or SUS.

12. The method according to claim 1, wherein the protective film has a thickness in the range of 5 to 200 μm.

13. The method of claim 1 wherein the solid flexible protective layer covers the devices and closely follows the entire contours of the protrusions.

* * * * *